(12) United States Patent
Wang et al.

(10) Patent No.: US 9,899,425 B2
(45) Date of Patent: Feb. 20, 2018

(54) ARRAY SUBSTRATE AND MANUFACTURING METHOD THEREOF

(71) Applicant: Shenzhen China Star Optoelectronics Technology Co., Ltd., Shenzhen, Guangdong (CN)

(72) Inventors: Cong Wang, Guangdong (CN); Peng Du, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 120 days.

(21) Appl. No.: 14/781,536

(22) PCT Filed: Aug. 14, 2015

(86) PCT No.: PCT/CN2015/087002
§ 371 (c)(1),
(2) Date: Sep. 30, 2015

(87) PCT Pub. No.: WO2017/020345
PCT Pub. Date: Feb. 9, 2017

(65) Prior Publication Data
US 2017/0170198 A1    Jun. 15, 2017

(30) Foreign Application Priority Data
Aug. 5, 2015 (CN) .......................... 2015 1 0473674

(51) Int. Cl.
*H01L 27/14*     (2006.01)
*H01L 27/12*     (2006.01)
(Continued)

(52) U.S. Cl.
CPC ........ *H01L 27/124* (2013.01); *H01L 21/2253* (2013.01); *H01L 21/26513* (2013.01);
(Continued)

(58) Field of Classification Search
CPC ............... H01L 27/124; H01L 21/2253; H01L 21/26513; H01L 29/4908; H01L 29/66757; H01L 29/78675
See application file for complete search history.

(56) References Cited

U.S. PATENT DOCUMENTS

2007/0007530 A1* 1/2007 Wong .................... H01L 29/458
257/66
2015/0008398 A1* 1/2015 Lee ...................... H01L 51/5212
257/40

(Continued)

*Primary Examiner* — Victor A Mandala
*Assistant Examiner* — Colleen E Snow
(74) *Attorney, Agent, or Firm* — Andrew C. Cheng

(57) ABSTRACT

A manufacturing method for an array substrate is provided in the present invention. The method comprises: forming a Poly-Silicon layer on a glass substrate; forming heavily doped regions by performing heavily doping and activation process at both sides of the Poly-Silicon layer; forming a source/a drain of a first metal layer growing on the heavily doped region; forming a gate of both a gate insulator and a second metal layer growing sequentially on the Poly-Silicon layer, wherein, a material of the second metal layer is aluminum. The activation technology process can be improved in the present invention to reduce RC delay in metal wires of product and then further to achieve large sizes for products.

6 Claims, 2 Drawing Sheets

(51) Int. Cl.
*H01L 29/66* (2006.01)
*H01L 29/49* (2006.01)
*H01L 29/786* (2006.01)
*H01L 21/225* (2006.01)
*H01L 21/265* (2006.01)

(52) U.S. Cl.
CPC .... *H01L 29/4908* (2013.01); *H01L 29/66757* (2013.01); *H01L 29/78675* (2013.01)

(56) References Cited

U.S. PATENT DOCUMENTS

| | | | |
|---|---|---|---|
| 2016/0254368 A1* | 9/2016 | Jiang | H01L 21/28088 257/72 |
| 2017/0125605 A1* | 5/2017 | Sano | H01L 29/78693 |

* cited by examiner 115 117 111 118 114   115   113 116   120   112  119   121

ARRAY SUBSTRATE AND MANUFACTURING METHOD THEREOF

TECHNICAL FIELD

The present invention is related to a liquid display technology field, more particularly to an array substrate and a manufacturing method thereof.

BACKGROUND

Generally a metal Pattern on active layer top is utilized as a mask at heavily doped region in the tanditional Low Temperature Poly-silicon (LTPS), and then an activation process is performed after doping finished.

A schematic figure of a manufacturing method of the tranditional away substrate is shown as FIG. 1. After deposing a buffer layer 112 and a Poly-Silicon layer (Poly) 113 sequentially, turning into demanding patterns by exposure, development, etching, and then further performing with excimer laser annealer (ELA). Next, depositing a gate insulator (GI) 114, depositing a first metal layer (Metal 1) 115 on the top of the GI, etching patterns in demand, revealing a doping-needed part on the Poly layer, covering the no-doping-needed part of the Poly later 113 via utilizing the first metal layer 115, and doping directly to form a heavily doped region 116. The activation process is performed in high temperature after performing heavily doping to form ohmic contact achieving from a semiconductor layer and a metal layer (a source/a drain) and then increase conductivity of the Thin Film Transistor. Because the activation temperature is higher and the first metal layer 115 has been deposited as gate on the substrate at the same time, an adoptable material for the first metal layer 115 should be thermostable. An inter layer dielectric (ILD) layer 117 is deposited after performing activing, etched the patterns in demand, and then reveal the Poly layer 113 where needs to contact with metal. A second metal layer (Metal2) is further deposited to form a Source/a Drain. Finally, an indium tin oxide (ITO) transparent bottom conductivity film 119, a passivation layer 120 and a ITO top thin film 121 are deposited sequentially.

Because the activation temperature is higher and a better thermostability for a metal layer is required, generally Molybdenum (Mo) is applied for a metal under the active layer; however, the resistance for metal Mo is very high to be applied as a conductive metal material, and the RC delay is occurred seriously because of signal wires made of the metal Mo so that affecting reliabilities of image displays and even counting against large sizes for products.

DISCLOSURE OF INVENTION

An array substrate and a manufacturing method thereof are provided in a embodiment of the present invention to reduce RC delay in metal wires of product and then further to achieve large sizes for products.

To achieve the aforementioned technical programs, a technical plan applied in the present invention is: providing a manufacturing method for an array substrate, comprising: forming a Poly-Silicon layer on a glass substrate; forming heavily doped regions by performing heavily doping and activation process at both sides of the Poly-Silicon layer; forming a source/a drain of a first metal layer growing on the heavily doped region; forming a gate of both a gate insulator and a second metal layer growing sequentially on the Poly-Silicon layer, wherein, a material of the second metal layer is aluminum; wherein, the first mental layer is formed on both sides of the heavily doped regions of the Poly-Silicon layer; a passivation layer and an ITO top thin film are further growing sequentially on the second metal layer.

Wherein, an ITO bottom thin film is disposed on one side of the first metal layer of the Poly-Silicon layer.

Wherein, the material of the first metal layer is aluminum.

To solve the aforementioned technical problem, another technical plan applied in the prevent invention is: providing a manufacturing method for an array substrate, comprising: forming a Poly-Silicon layer on a glass substrate; forming heavily doped regions by performing heavily doping and activation process at both sides of the Poly-Silicon layer; forming a source/a drain of a first metal layer growing on the heavily doped regions; forming a gate of both a gate insulator and a second metal layer growing sequentially on the Poly-Silicon layer, wherein, a material of the second metal layer is aluminum.

Wherein, the source/the drain of the first metal layer is disposed on both sides of the heavily doped regions of the Poly-Silicon layer.

Wherein, an ITO bottom thin film is disposed on one side of the first metal layer of the Poly-Silicon layer.

Wherein, the material of the first metal layer is aluminum.

Wherein, a passivation layer and an ITO top thin film are further growing sequentially on the second metal layer.

To solve the aforementioned technical problem, the another technical plan applied in the present invention is: further providing an array substrate, comprising: a glass substrate; a Poly-Silicon layer is disposed on the glass substrate, and both sides of the Poly-Silicon layer are heavily doped regions; a first metal layer is disposed on the heavily doped region to form a source/a drain; a gate insulator and a second metal layer are disposed sequentially on the Poly-Silicon layer, wherein, a material of the second metal layer is aluminum to form a gate.

Wherein, a buffer layer is further disposed between the glass substrate and the Poly-Silicon layer.

Wherein, a material of the first metal layer is aluminum.

Wherein, an ITO bottom thin film is disposed on one side of the first metal layer of the Poly-Silicon layer.

Wherein, activation process is performed on the heavily doped region right after performing heavily doping.

Beneficial effects of the present invention by performing the aforementioned plans are: the present invention forming a Poly-Silicon layer on a glass substrate, forming a heavily doped regions by performing heavily doping and activation process at both sides of the Poly-Silicon layer; forming a source/a drain of a first metal layer growing on the heavily doped region; a gate insulator and a second metal layer are disposed sequentially on the Poly-Silicon layer, wherein, a material of the second metal layer is aluminum to reduce RC delay in metal wires of product and then further to achieve large sizes for products.

BRIEF DESCRIPTION OF THE DRAWINGS

Reference will now be made in detail to example embodiments, examples of which are illustrated in the accompanying drawings, the present example embodiments may have different forms and should not be construed as being limited to the descriptions set forth herein. Specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure. Wherein.

DETAILED DESCRIPTION OF THE PREFERRED EMBODIMENTS

In order to make the present invention more understandable and complete, references are made to detailed descriptions set forth hereinafter in conjunction with the preferred embodiment of the invention and figures. Obviously, the descriptive embodiments are only part of embodiments of the invention, but not all of the embodiments. Based on the embodiment of the invention, other embodiments obtained by a person killed in the art without inventive diligent belong to the invention claims.

Figure 1:
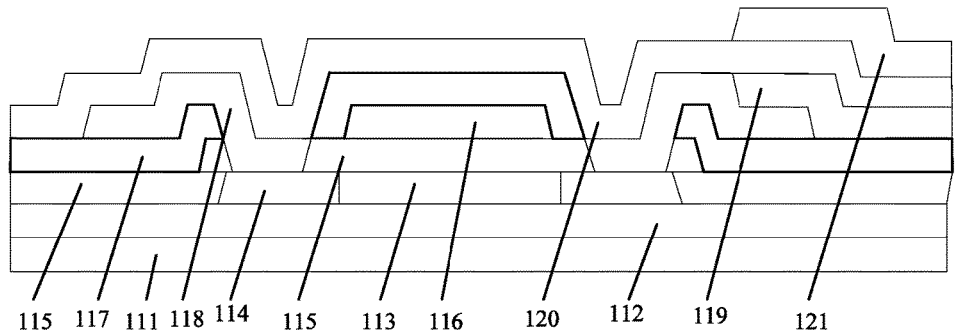
FIG. 1 is a schematic diagram illustrating a manufacturing method for an array substrate according to conventional art.
Figure 2:
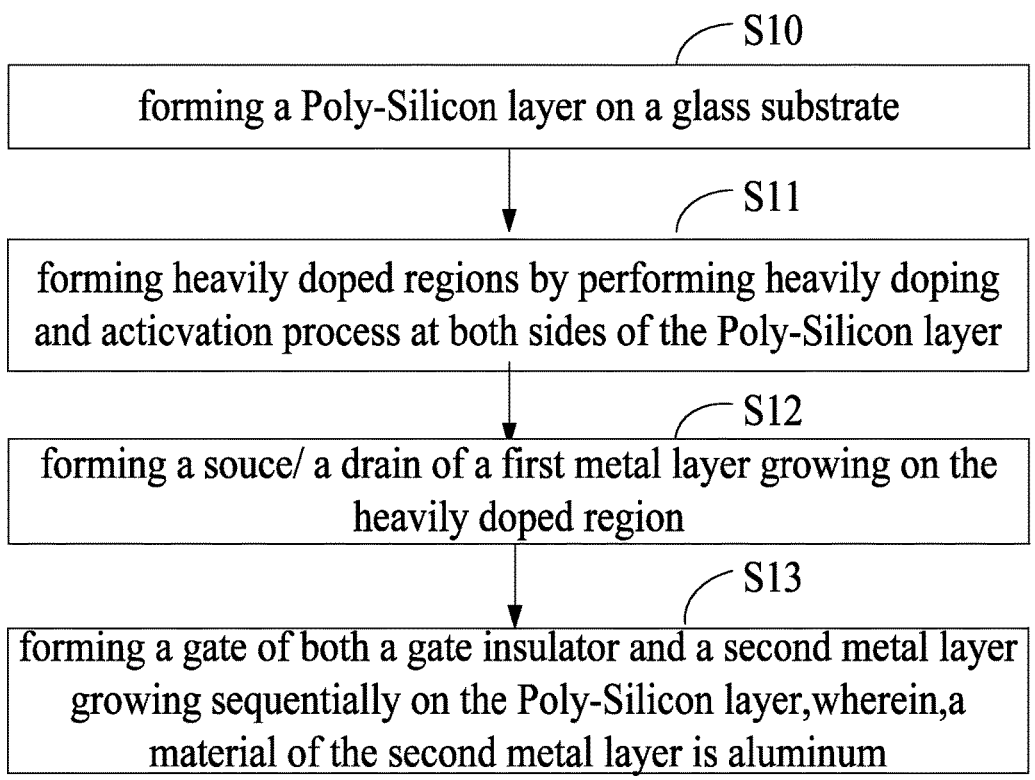
FIG. 2 is a schematic flow diagram illustrating a manufacturing method for the array substrate according to the embodiment of the present invention.
Figure 3:
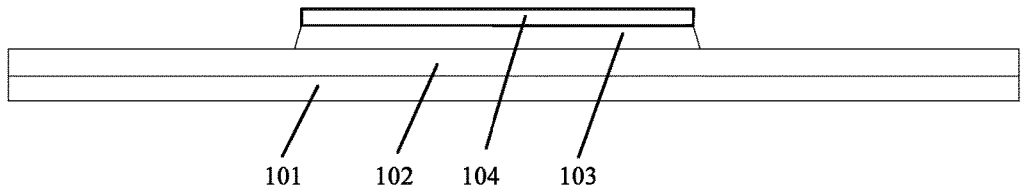
FIG. 3 is a schematic diagram illustrating a manufacturing method for a Poly-Silicon layer of the array substrate according to the embodiment of the present invention.

Referring to FIG. 2, FIG. 2 is a schematic flow diagram illustrating a manufacturing method for the array substrate according to the embodiment of the present invention. As shown in FIG. 2, the manufacturing method for the array substrate comprises:

In step S10: forming a Poly-Silicon layer on a glass substrate;

wherein, a buffer layer is further growing between the glass substrate and the Poly-Silicon layer; As shown in FIG. 3, the buffer layer 102 is growing on the glass substrate 101, and then the Poly-Silicon layer 103 is further growing on the buffer layer 102; the surface of the Poly-Silicon layer 103 is crystallized after performing with excimer laser annealer (ELA) on the substrate, and also performing masking and etching to form a shape as shown in FIG. 3, wherein, Photoresist (PR) 104 is formed.

Figure 4:
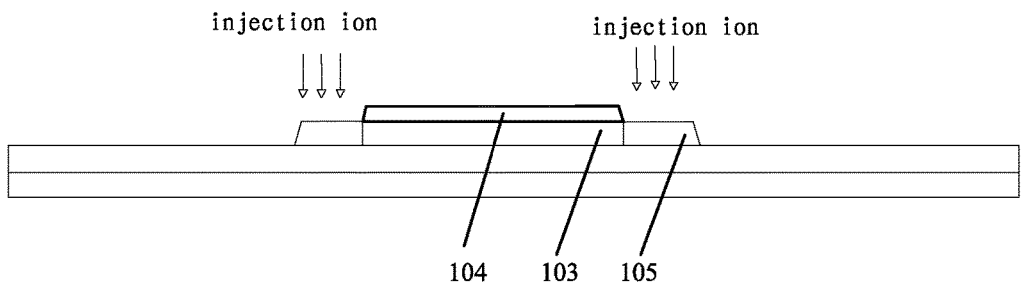
FIG. 4 is a schematic diagram illustrating a heavily doping process of the array substrate according to the embodiment of the present invention.

Step S11: forming heavily doped regions by performing heavily doping and activation process at both sides of the Poly-Silicon layer. As shown in FIG. 4, furthermore, masking process is performed to the remaining Photoresist; a heavily doped region 105 is formed by removing the Photoresist 104 on the Poly-Silicon layer 103, and heavily doping is performed. The heavily doped region 105 can form ohmic contact with metal. Heavily doping is preferably utilized by ion implantation method. The Photoresist 104 on the Poly-Silicon layer 103 is removed after performing heavily doping.

Then activation process is performed on the heavily doped region 105. Because activation temperature is higher, preferably generally 600° C., each layers having formed before activation process should be thermostable. In the embodiment of present invention, a metal layer is not manufactured before activation process is performed on the heavily doped region 105 so that the thermostability of metal is not considered.

Figure 5:
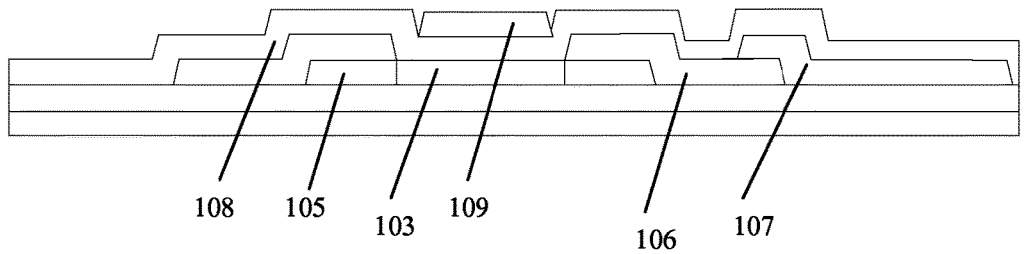
FIG. 5 is a schematic diagram illustrating a manufacturing method for a first metal layer of the array substrate according to the embodiment of the present invention.

Step S12: forming a source/a drain of a first metal layer growing on the heavily doped region;

As shown in FIG. 5, after performing activation process on the heavily doped region 105, a first mental layer 106 is disposed on both sides of the heavily doped regions 105 of the Poly-Silicon layer 103 to form a source/a drain. Ohmic contact is made by the heavily doped regions 105 forming a source/a drain. An ITO bottom thin film 170 is disposed on one side of the first metal layer 106 of the Poly-Silicon layer 103. The ITO bottom thin film 170 is generally disposed on the gate to be a pixel electrode. A material of the first metal layer 106 can be aluminum as well.

In Step S13: forming a gate of both a gate insulator and a second metal layer growing sequentially on the Poly-Silicon layer, wherein, a material of the second metal layer is aluminum.

Referring to FIG. 5, after the first metal layer 106 is manufactured, a gate insulator is deposed, and then the second metal layer is deposed on a gate insulator 108 that is directly above the Poly-Silicon layer 103. The second metal layer 109 is aluminum, and is made of the gate of display panel. Afterwards, a passivation layer and a ITO top thin film are sequentially deposed. Wherein, the ITO top thin film is made of common electrodes of a display panel. Compared with the conventional art, the manufacturing method for the array substrate according to the embodiment of the present invention reduces manufacturing a interposed medium layer, optimizes the manufacturing process, and can reduce the cost for manufacturing.

Compared Al metal with Mo metal, the resistivity of Al metal is very low, and the load of trace is less so that the RC delay causing by metal trace can be reduced efficiently, the reliability of display panel is increased, and it is advantageous to large size of LTPS display panel.

Figure 6:
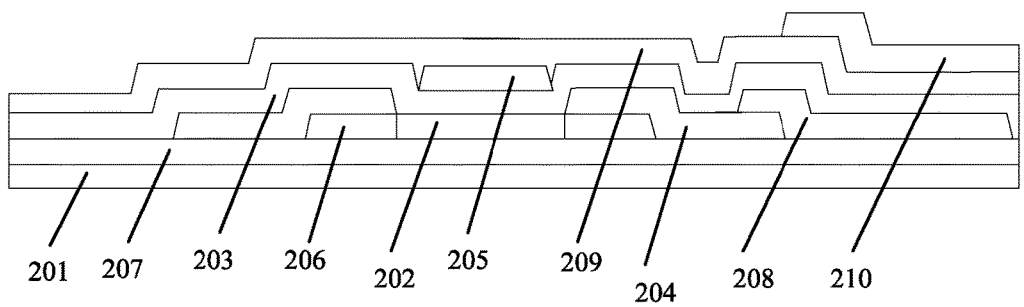
FIG. 6 is a schematic diagram showing the construction of the array substrate according to the embodiment of the present invention.

FIG. 6 is a schematic diagram showing the construction of the array substrate according to the embodiment of the present invention. Referring to FIG. 6, the array substrate comprises: a glass substrate 201, a Poly-Silicon layer 202, a gate insulator 203, a first metal layer 204, and a second metal layer 205. The Poly-Silicon layer 202 is disposed on the glass substrate 201, and both sides of the Poly-Silicon layer 202 are heavily doped regions 206; the first metal layer 204 is disposed on the heavily doped region 206 to form a source/a drain; the gate insulator 203 and the second metal layer 205 are disposed sequentially on the Poly-Silicon layer 202, wherein, a material of the second metal layer 205 is aluminum to form a gate.

In the embodiment of the present invention, a buffer layer 207 is further disposed between the glass substrate 201 and the Poly-Silicon layer 202. A material of the first metal layer 204 is aluminum. An ITO bottom thin film 208 is disposed on one side of the first metal layer 204 of the Poly-Silicon layer 202. A passivation layer 209 and the ITO top thin film 210 are further growing sequentially on the second metal layer 205. The ITO bottom thin film 208 is made of the pixel electrode of display panel. The ITO top thin film 210 is made of the common electrode of display panel. Compared with the conventional art, the manufacturing method for the array substrate according to the embodiment of the present invention reduces manufacturing a interposed medium layer, optimizes the manufacturing process, and can reduces the cost for manufacturing.

Activation process is performed on the heavily doped region 206 right after performing heavily doping. Because activation temperature is higher, preferably generally 600° C., the thermostability of each layer having already formed before performing activation process is well. However, activation process is performed on the heavily doped region 206 of the array substrate according to the embodiment of the present invention after performing heavily doping; at this time, the first metal layer 204 and the second metal layer 205 have not been manufactured so that the ability of metal thermostability is not considered. The first metal layer 204 and the second metal layer 205 can also be aluminum having lower the resistivity; compared with Mo metal, the load of trace is less so that the RC delay causing by metal trace can be reduced efficiently, and the reliability of display panel is increased.

As described above, according to the present invention, the buffer layer is disposed on the glass substrate, both sides of the Poly-Silicon layer are heavily doped regions, and activation process is performed on the heavily doped region right after performing heavily doping; the gate insulator and a second metal layer are disposed sequentially on the Poly-Silicon layer, wherein, a material of the second metal layer is aluminum to reduce RC delay in metal wires of product and then further to achieve large sizes for products.

The aforementioned is only one embodiment of the invention, but not for limiting the claims of the invention; any equivalent device or equivalent effect flowchart, or directly or indirectly application in other related technical fields are all included in the claims of the invention.

The invention claimed is:

1. A manufacturing method for an array substrate, wherein the method comprises steps of:
    forming a Poly-Silicon layer on a glass substrate;
    forming heavily doped regions by performing a heavily doping and an activation process at both sides of the Poly-Silicon layer;
    forming a source/a drain of a first metal layer grown on the heavily doped region;
    forming a gate of both a gate insulator and a second metal layer grown sequentially on the Poly-Silicon layer, wherein a material of the second metal layer is aluminum;
    wherein the step of forming a source/a drain of a first metal layer grown on the heavily doped region is performed after the step of forming heavily doped regions, and the step of forming a gate of both a gate insulator and a second metal layer grown sequentially on the Poly-Silicon layer is performed after the step of forming a source/a drain of a first metal layer grown on the heavily doped region;
    wherein a buffer layer is further grown between the glass substrate and the Poly-Silicon layer; a passivation layer and an ITO top thin film are further grown sequentially on the second metal layer after the step of forming a gate of both a gate insulator and a second metal layer grown sequentially on the Poly-Silicon layer;
    wherein an ITO bottom thin film is grown on one side of the first metal layer of the Poly-Silicon layer and connected with the first metal layer before the step of forming a gate of both a gate insulator and a second metal layer grown sequentially on the Poly-Silicon layer; the gate insulator is disposed overlying the first metal layer and the ITO bottom thin film and whereby the ITO bottom thin film is located between the gate insulator and the first metal layer;
    wherein the ITO bottom thin film is used as a pixel electrode, the ITO top thin film is spaced from the ITO bottom thin film by the gate insulator and the passivation layer and used as a common electrode.

2. The manufacturing method according to claim 1, wherein a material of the first metal layer is aluminum.

3. An array substrate, wherein the array substrate comprises:
    a glass substrate;
    a Poly-Silicon layer disposed on the glass substrate, and both sides of the Poly-Silicon layer are heavily doped regions;
    a first metal layer disposed on the heavily doped regions to form a source/a drain;
    a gate insulator and a second metal layer disposed sequentially on the Poly-Silicon layer and the first metal layer, wherein a material of the second metal layer is aluminum to form a gate;
    wherein the first metal layer is located between the heavily doped regions and the gate insulator and further is covered by the gate insulator;
    wherein an ITO bottom thin film is disposed on one side of the first metal layer of the Poly-Silicon layer and connected with the first metal layer, the ITO bottom thin film is located between the first metal layer and the gate insulator and further is covered by the gate insulator, the ITO bottom thin film is used as a pixel electrode;
    wherein a passivation layer and an ITO top thin film are disposed sequentially on the second metal layer and the gate insulator and whereby the passivation layer is located between the ITO top thin film and the gate insulator, the ITO top thin film is spaced from the ITO bottom thin film by the gate insulator and the passivation layer and used as a common electrode.

4. The array substrate according to claim 3, wherein a buffer layer is further disposed between the glass substrate and the Poly-Silicon layer.

5. The array substrate according to claim 4, wherein a material of the first metal layer is aluminum.

6. The array substrate according to claim 5, wherein an activation process is performed on the heavily doped region right after performing a heavily doping.

* * * * *